United States Patent [19]

Simeau

[11] 4,223,181
[45] Sep. 16, 1980

[54] METHOD AND APPARATUS FOR PROCESSING SIGNALS

[76] Inventor: Bernard J. Simeau, 9, rue des Cites - Chadrac, 43000 LePuy, France

[21] Appl. No.: 930,250

[22] Filed: Aug. 2, 1978

[30] Foreign Application Priority Data

Aug. 9, 1977 [FR] France .............................. 77 24494

[51] Int. Cl.² ............................................. H04R 3/00
[52] U.S. Cl. .................... 179/1 D; 333/174; 455/307
[58] Field of Search ............ 179/1 D, 1 F, 1 G; 333/167, 174; 325/477

[56] References Cited

U.S. PATENT DOCUMENTS

| | | | |
|---|---|---|---|
| 2,148,994 | 2/1939 | Mennerich | 179/1 D |
| 2,760,011 | 8/1956 | Berry | 179/1 D |
| 2,832,828 | 4/1958 | Levy | 179/1 D |
| 3,921,077 | 11/1975 | Suzuki | 325/477 |

Primary Examiner—Douglas W. Olms
Attorney, Agent, or Firm—Edmond T. Patnaude

[57] ABSTRACT

Auto-adaptive filtering devices for analysis and treatment or processing of A.F. signals.

These devices are characterized in that they include filtering means splitting the applied signals into two parts or channels having complementary spectra, a first channel being considered as error channel to determine a function of versus predetermined criteria, the transmission of the other channel and to react on the positioning of the cutoff frequencies of the filtering means.

Main applications being noise reducers, band-reduction devices, devices for speech analysis and synthesis.

23 Claims, 9 Drawing Figures

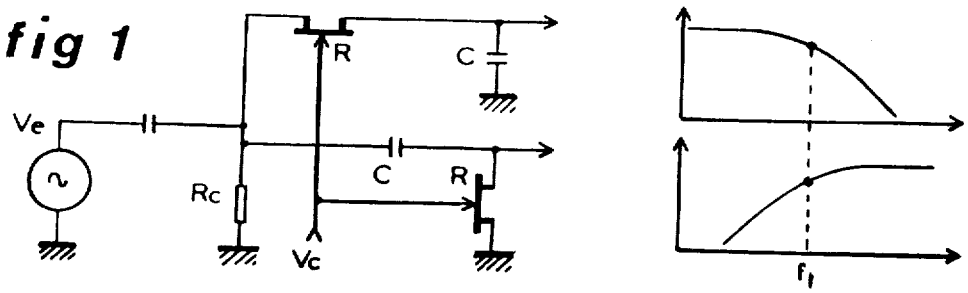
fig 1
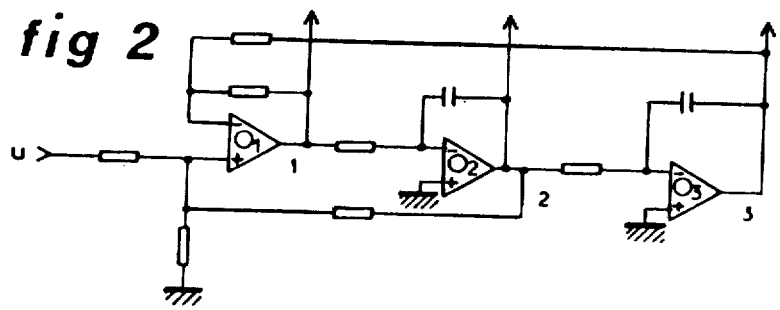
fig 2
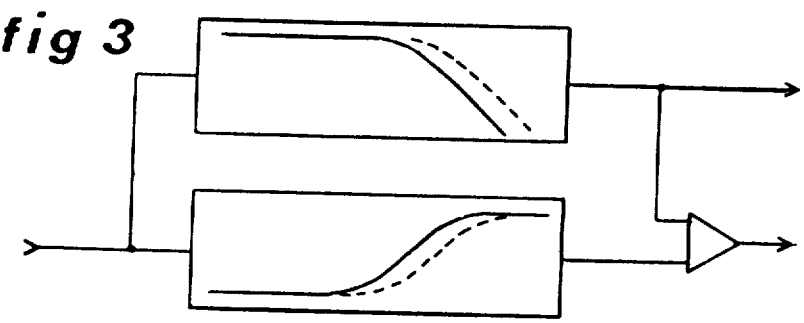
fig 3
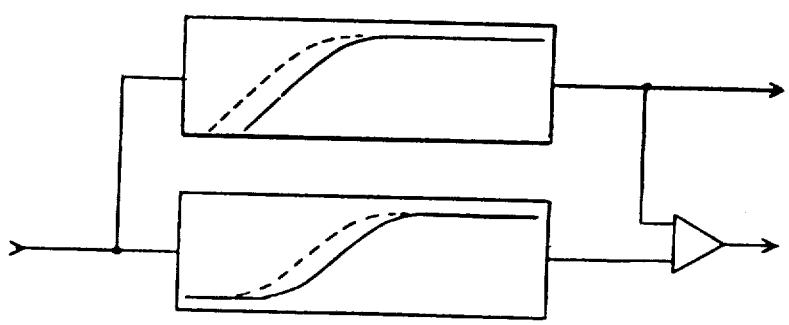

5a

5b

METHOD AND APPARATUS FOR PROCESSING SIGNALS

The present invention relates to signal analyzing and processing apparatus using an adaptive filter whose transmission frequency band is controlled by a feedback circuit including the filter itself. The system of this invention is particularly suited for audio frequency noise reduction in telecommunication equipment.

BACKGROUND OF THE INVENTION

Adaptive filters, sometimes called dynamic filters or auto-adaptive filters have a transmission frequency band which is shifted in response to the content of the applied signal. They are mainly used for noise reduction or signal restoration in audio frequency transmission systems. The book by R. Masschu entitled *Techniques du Magnetophone* Editions Radio, Paris 1974, describes on page 242 et seq., the principals of operation of several of these systems.

These prior art systems generally function either by rejection of a portion of the frequency spectrum containing little useful information or by expansion of the entire signal followed by compression of the low level signal components. The first method is a one way process and is employed in the well known DNE and DNF systems and the latter method, which is a complimentary function process, is used in the well known Dolby A and B systems and in the ANRS system. Moreover, the portion of the spectrum containing the desired information may be fixed as in the DNL and Dolby A systems or it may be varied in relation to the content of the desired part of the spectrum as in the Dolby B, ANRS and DNF systems.

These one way noise reduction systems are designed for incorporation in sound transmission or sound reproduction apparatus to attenuate the noise components which are present in the rejected part of the signal spectrum. They are applicable to any signals whatever and are therefore compatible with all types of systems because their use only affects the audible noise level of the system in which they are used.

The complimentary function systems, which are designed to reduce the effect of the noise introduced into the signal during processing of the signal, carry out a portion of the process before transmission or recording. Thereafter, and prior to reproduction the signal is restored to its non-distorted condition by a reverse or complimentary process. These types of systems are not, therefore, compatible.

These types of systems have in common the fact that they include means fulfilling the functions of a frequency meter to detect the presence of a signal within the operating frequency bands. Such means vary the cut-off frequencies of the associated band pass filters in relation to the bandwidth of the incoming signal. Inasmuch as this frequency meter function can be independent, at least to some degree, of the signal levels, the desired adjustment of the cut-off frequencies of the associate filters is only approximately obtained, for example, by means of rectifiers, limiters and fixed-frequency filter circuits.

The possible uses of these systems are thus limited because of this defect which results from the uncertainty about the positioning of the cut-off frequencies of the filters relative to the useful part of the signal spectrum. Consequently, these prior art systems must either accept a reduction of the transmitted spectrum, which thus downgrades the quality of the reproduced signal, or reverse a safety margin which also reduces their efficiency. Moreover, the complimentary function systems require an accurate level adjustment of the signals at the moment of their restoration or reproduction.

The performance of audio reproducing apparatus could be significantly improved if there were available a sure means of determining, as a function of precise criteria, the useful bandwidth of a signal. In other respects, such a means would enable new ways of resolving many technical problems, particularly all those where a fixed bandwidth is assigned for transmission of a signal when in fact the bandwidth effectively used is, at least instantaneously, much narrower, thus resulting in an efficient use of the transmission means.

SUMMARY OF THE INVENTION

The present invention provides novel methods and means for the analysis and processing of signals, which methods and means resolve the heretofore discussed problems of the prior art signal processing systems. In accordance with the teachings of the invention, the incoming signal is applied to an active filter which splits the signal into two parts respectively above and below a transition or partition frequency. This active filter may be selected from the many known types to comply with predetermined laws of regularity of response, attenuation slope, and/or dephasing. Moreover, by the use of known components having a variable impedance under the control of a control signal, the transition frequency of the filter is adjustable. One such variable impedance device is a field effect transistor used as a variable resistance diode with capacitance variation. Several embodiments of such a filter and the means for spliting the incoming signal into two parts of complimentary spectra are described in detail hereinafter.

According to the present invention, there is provided an analysis and signal processing device having an error channel which carries one of the complimentary spectra signals and a main channel which carries the other complimentary spectra signal. The transmission characteristics of the main channel are controlled by the signal carried by the error channel which controls the transition frequency.

A characteristic of the analysis and processing device of this invention is that the signal carried by the error channel may be amplified if necessary, and then after rectification, compared with a fixed or variable reference signal representing the permitted error. The difference signal which results is amplified and/or integrated and used to control the separation frequency of the filter with such a phase that the separation frequency tends to be adjusted in such a manner as to restore the equality between the established error and the reference signal.

A particular feature of the filter circuit of the invention is that the signal which controls the transition or separation frequency itself carries information which may be used for other purposes such, for example, as for measuring or transmitting the value of the separation frequency, and/or for controlling the cut-off frequency of other similar filters or other devices such as oscillators.

Also the present invention relates to the simultaneous use of several filters as well as the use thereof in combination with other known signal processing circuits such as modulation expanders, compressors, and fixed-frequency filters as a way of accomplishing more sophisticated functions.

As it appears, the invention can be embodied in many ways, and other characteristics and advantages will become apparent from the following description of the principals of embodiments and some applications, described as non-restrictive examples, with the accompanying drawings wherein:

FIG. 1, 2 and 3 are circuit diagrams of three different means for splitting a signal into two parts of complementary spectra.

FIG. 5a and 5b show two modes of construction of a filtering device according to the invention in which;

Figure 4:
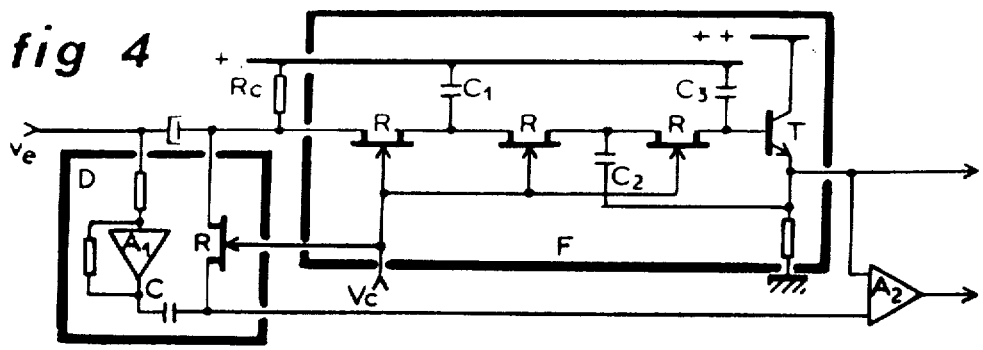
FIG. 4 is a schematic circuit diagram of a preferred embodiment of the invention.

As explained hereinabove, the system of the present invention includes a first filter means designed to split the incoming signal into two parts of complementary spectra appearing on two separate outputs of a filter.

A first method for obtaining this result is to use two separate filters, one being a low-pass filter and the other being high-pass filter. FIG. 1 shows a schematic diagram of a filtering means applying this method. The two filters are constituted by simple passive RC networks where the electronically controllable components which vary the common transition frequency $f_t$ are field effect transistors (FET). A voltage Vc controls the transition frequency and is the common gate voltage of the two FETS. These FETS are selected to have very close resistance versus gate voltage characteristics, and for which at least one of the source or drain electrodes is maintained at a common DC reference voltage, here the ground voltage, by DC conductive means. The $R_c$ resistor, which may be of high value, ensure this function for the upper one of the FETs in the diagram of FIG. 1.

The resistance R of the FETs determine the transition frequency of the filter and is variable between very wide limits as a function of the control voltage Vc, according to the law $R = (Ro/1 - Vc/V_p)$ where Ro represents the saturation resistance for a voltage $Vc = 0$ and Vp is the FET's pinch-off voltage.

In practice, changes in the value of R and consequently in the value of $f_t$ in a ratio of 20 or more can be achieved and are usable if the amplitude of the applied signal is limited so as to avoid the non-linear distortion phenomena.

Means other than FETs can be used to vary simultaneously the impedance of components of the filters and therefore, their transition frequency are known in the present art and will lead to equivalent results. Such components include resistors varying with light temperature and magnetic field diodes with capacity variation saturable inductors, or still servomechanisms actuating regulatable components such as potentiometers or variable condensers.

A second method of splitting into two parts of complementary spectra an incoming signal is the use of universal active filters, so-called because they permit simultaneously low-pass, band-pass, high-pass transfer functions, etc. An example of such a filter circuit is described on page 94 of volume 3 of the *Manual d'Applications CIL* by J. F. Gazin, published by Société Sescosem (1974).

The principal operation of this circuit, reproduced in FIG. 2 is to achieve by two successive integrations of the signal $V_1$ supplied by the operational amplifier $O_1$ the transfer functions $v_2 = v_1/p$ and $v_3 = v_1/p^2$, then by addition in the adder amplifier $O_1$ to synthetize a transfer function such as:

$$k_1 - k_2 v_1/p - k_3 v_1/p^2 = v_1, \text{ or}$$

$$v_1/v = \frac{k_1 p^2}{p^2 + pk_2 + k_5}$$

which is a transfer function of a second order high-pass filter. Simultaneously, the output of the first integrator $O_2$ delivers a transfer function of a band-pass filter:

$$v_2/v = \frac{k_1 p}{p^2 + k_2 p \, k_3},$$

and the output of the second integrator $O_3$ a transfer function of a low-pass filter:

$$v_3/v = \frac{k_1}{p^2 + k_2 p + k_3}$$

The polynomial in the denominator determines, as is known, the type of filter which can be selected freely according to the response curve of the filter.

A third method, which leads to a reduction in the number of the needed active components, may be preferred. It consists in using only one low-pass or high-pass filter to obtain the complementary spectrum output by difference with the applied signal; however, it will usually be necessary so as to obtain a satisfactory transfer function from the second synthesized channel to carry out previously a phase correction on the applied signal by means of an all-pass filter.

This method whose possible synoptic diagrams are given in FIG. 3, is detailed hereinafter in the case of a third order filter of the Butterworth type.

Such a filter whose normalized transfer function is of the form: $(1 + 2p + 2p^2 + p^3) - 1$ for a low-pass filter has a particular interest for the processing of audio frequency signals, as will be demonstrated later; its response curve is without ripple, its group delay is quite constant and its asymptotic slope of attenuation is 18 dB/octave.

The Nov. 11, 1976 issue of the periodical *Electronics* gives, on page 111, an example of simple design (called controlled source technique) of this type of filter, which is reproduced inside the frame F, FIG. 4. The transistor T is connected a common collector configuration and acts as a unity-gain amplifier. It may of course be replaced by more performing circuits. The three identical resistors R of the filter are provided as indicated previously, by FETs. This filter has a third order Butterworth-type response if there are, between the values of the capacitors $C_1$, $C_2$, $C_3$ ratios such that:

$$C_1 = 1.3926 \, C; \, C_2 = 3.5468 \, C; \, C_3 = 0.20245 \, C.$$

The phase correcting circuit D is constituted, in known manner by a phase-changing network (gain $= -1$) using an inverting amplifier and an RC circuit comprising also, in place of R, and FET identical to the preceding ones. This phase correcting circuit has a transfer function $(1-p)/(1+p)$ for the input signal $V_e$.

It is easy to demonstrate that the difference between the signals delivered by the low-pass filter, on one hand, and by the phase correcting circuit, on the other hand, has a transfer function: $p^3(1+2p+2p^2+p^3)^{-1}$, that is to say a third order high-pass response of the Butterworth type.

If the four gate electrodes of the FETs of the filter F and of the phase correcting circuit D are connected together and biased by a common control voltage Vc, it is understandable that the transition frequency common to the high-pass and low-pass outputs may be adjusted between wide limits.

In the schematic diagram of FIG. 4, the high-pass filter function is synthetized by means of the $A_2$ differential amplifier. The latter, as well as the phase correcting circuit D can be of a simplified technology and may have defects that will disturb the response accuracy of the high-pass filter. This may be a hindrance or not, depending on the applications, and generally speaking it will not be immaterial to use as the main channel a filter whose response is quasi perfect and as the error channel a filter having defects, or vice versa.

For these reasons, it may be preferable to design with the same technique a high-pass filter and to synthetize the low-pass filter function by means of a phase correcting circuit and an amplifier.

Likewise and always according to the applications, it will be possible, by a judicious selection of the type of filter and of the method used to adhere to obtain a preferred response curve (particularly an attenuation slope) on one of the channels, the other channel having less elaborated characteristics; it will even be possible in some cases to suppress the phase correcting circuit D, for instance if the main channel, that would have to be synthetized, was not used.

Lastly, the notion of cut-off frequency (conventionally at $-3$ dB) may within the field of the invention have a differently defined nature.

Beyond these first means for splitting a signal into two parts of complementary spectra, fitted with a control of their separation frequency, the invention comprises also second means for treating the signal delivered by the error channel in order to react on the frequency control of the first means and to constitute in like manner an auto-adaptive filter.

These second means, which appear in FIG. 5a comprise: a rectifying circuit Rd, which may be preceded by an amplifier at which the signal delivered by the error channel is applied, and a D.C. amplifier $A_3$ whose input is connected with the above-mentioned rectifying circuit Rd and whose output delivers the signal controlling the transition frequency of the filter F and if necessary the phase correcting circuit D. This amplifier $A_3$ may receive on a second input which may be a differential input with regard to the first one a reference voltage giving-it an offset (or threshold) of functioning.

The polarity of the voltage delivered by the rectifying circuit Rd and the sign of the amplification factor of the amplifier $A_3$ are selected so that the adjustment of the transition frequency has for effect the reduction of the effective rms voltage of the signal present in the error channel by reduction of the assigned bandwidth—and correlatively the increase of the bandwidth assigned to the main channel.

The rectifying circuit Rd may be selected among the known devices: single or double alternance rectifiers, peak or rms detectors, according to the applications.

The amplification factor of the feed-back path, and mainly the one of the amplifier $A_3$, may be made variable, for instance to insure independently of the level of the applied signal a satisfactory stability of the feed-back loop. For the same reason, this amplifier will be advantageously wired as an integrator, which will permit it moreover to participate in the filtering of the applied voltage.

Finally, the field of linearity of the amplifier $A_3$, and mainly the range of its output voltage, could be volunarily limited, which would have the effect of fixing the lower and upper limits of the field of adjustment of the transition frequency.

FIG. 5b represents a variation of the first and second means where the rectifying circuit is preceded of an amplifier, as indicated previously.

Figure 6:
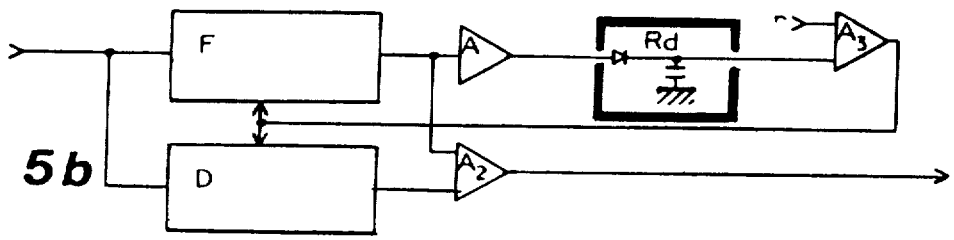
FIG. 6 is an explanatory diagram.
Figure 6:
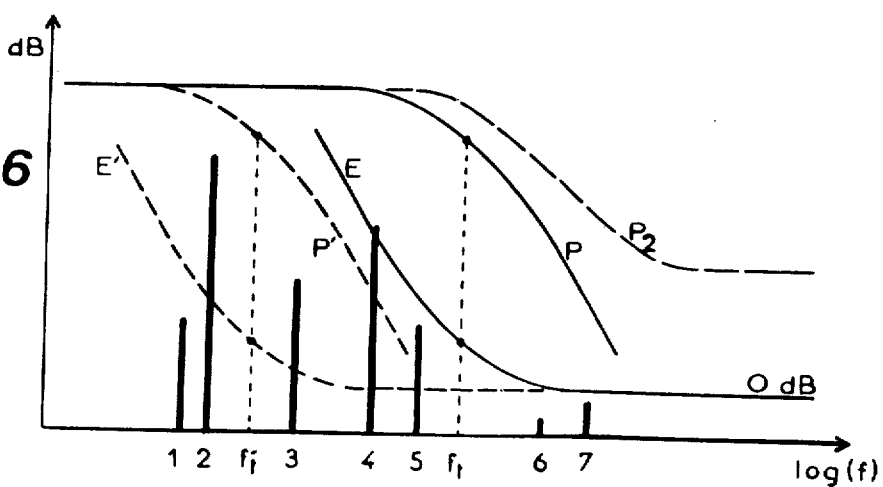

FIG. 6 shows on an amplitude frequency diagram of mode of functioning of this device in the case where the main channel is the output of a low-pass filter.

The segments 1 to 7 represent the individual levels of spectral rays of a complex A.F. signal applied at the input of the filtering device.

The curve E represents the attenuation applied by the error channel (high-pass filter) and the curve P the response curve of the main channel. For facilitating an understanding of the invention, the curves E and P appear consequently reversed one with regard to the other. The curves E and P have each a horizontal part and at least a first knee at a common transition frequency $f_t$.

In the absence of an input signal, the amplifier $A_3$ is saturated by the reference voltage $V_r$, and is in a waiting state where the transition frequency of the filtering device is held down to a lower limit value $f_t$. The attenuation of the error channel is then represented by the curve E' and the response of the main channel by the curve P'.

In the presence of a signal, as soon as a spectral ray of the applied signal reaches the level represented by the curve E', a D.C. rectified voltage is applied to the $A_3$ amplifier, which has the effect of translating the transition frequency of the filter to an equilibrium value $f_t$. In the example represented, only the ray 4 of the applied signal contributes to delivering the D.C. signal controlling the transition frequency and therefore is significant.

Figure 5:
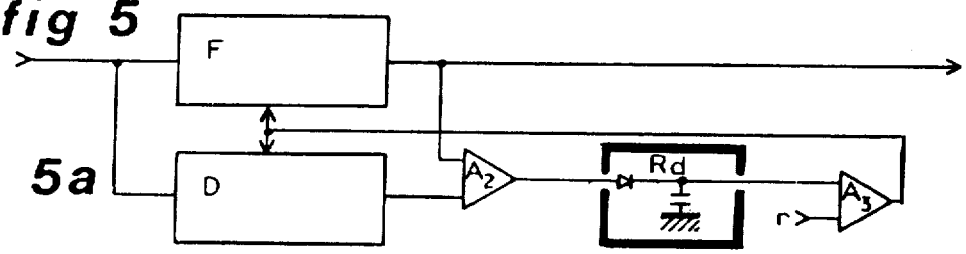

The O dB level of the curve E is shown in relation to the rays 1 to 7 at a level corresponding to the actuating threshold of the amplifier $A_3$, taking into account the reference voltage applied as represented in FIG. 5. The rays 6 and 7 are at too low a level to be taken into account and therefore are not significant ones.

It thus follows that the feed-back loop reacts by positioning the transition frequency $f_t$ in such manner that the curve E is applied against a first significant ray such as the ray 4, of a sufficient level considering its frequency to be able to contribute to the production of an error signal very close to the reference voltage $v_r$ when rectified. Simultaneously, the transmission of the signal within the main channel is shaped by the response curve P.

The possibilities and the modes of use of this device will be better understood through the description of the following examples of applications.

At first, we will assume that the curves of FIG. 6 apply to an A.F. noise reducer device whose responses of the main and error channels are of the third order Butterworth type.

The ray 4 determines the value of the transition frequency $f_t$ shown. This value is substantially higher than the frequency of ray 4. However, the presence of the ray 4, whose level of amplitude is relatively important in the A.F. signal, is accompanied in the audio sound by a mask effect. i.e. that the rays of a lower level and of adjoining frequency will not be perceived or heard. It has been experimentally demonstrated that, in the presence of a pure tone of high level the more a weaker signal was of a higher frequency, the more audible it was.

It it is admitted that the mask effect so characterized in regard to the qualities of the human ear has a slope of 18 dB/octave, it is taken into account that the frequency $f_t$ selected by the device is exactly positioned if the slope of the curve E is itself of 18 dB/octave.

As a matter of fact, taking into account the presence of the ray 4, the noise components weaker than the 0 dB level will not be heard up to the frequency $f_t$, and it is suitable to cancel, in the main channel, the components (noise) whose level is lower than 0 dB and whose frequency is higher than $f_t$. The frequency $f_t$ is therefore the maximum value of the upper limit of the bandwidth of the main channel which will not cause perceptible noise to appear while the processed signal will be least disturbed.

Besides, in the signal delivered by the main channel, a part of the noise is transmitted beyond the frequency $f_t$, considering the finite attenuation slope of the curve P. In a typical case ($f_t = RA^2$ and white noise disturbing the A.F. signal) the noise contribution resulting from this effect would be of about 6 dB for an attenuating slope of 6 dB/octave, 3 dB for a slope of 12 dB/octave and 1 dB for 18 dB/octave. Therefore, it is understandable that a slope of 18 dB/octave corresponds to a significant improvement with relation to lower slopes, while being a result of little interest to improve. For these reasons, here also a slope of 18 dB/octave, i.e. a third order filter will be preferred; as, in addition, this filter must have a steady and monotonous response curve, free from important deviations in its group velocity, it is ascertained that a third order Butterworth filter complies with these requirements.

Lastly, it will be noticed that once an important attenuation is reached in high frequency on the main channel, it is of little importance to have a perfect response curve since the result as to the audible noise reduction is obtained. The curve P will consequently be permitted a 20 to 40 dB attenuation is reached to have any shape whatsoever without damaging the audible result; such a curve is shown at $P_2$ in FIG. 6; it would preferably be formulated by using a diagram according to that of FIG. 5b where F would be a high-pass filter.

Figure 7:
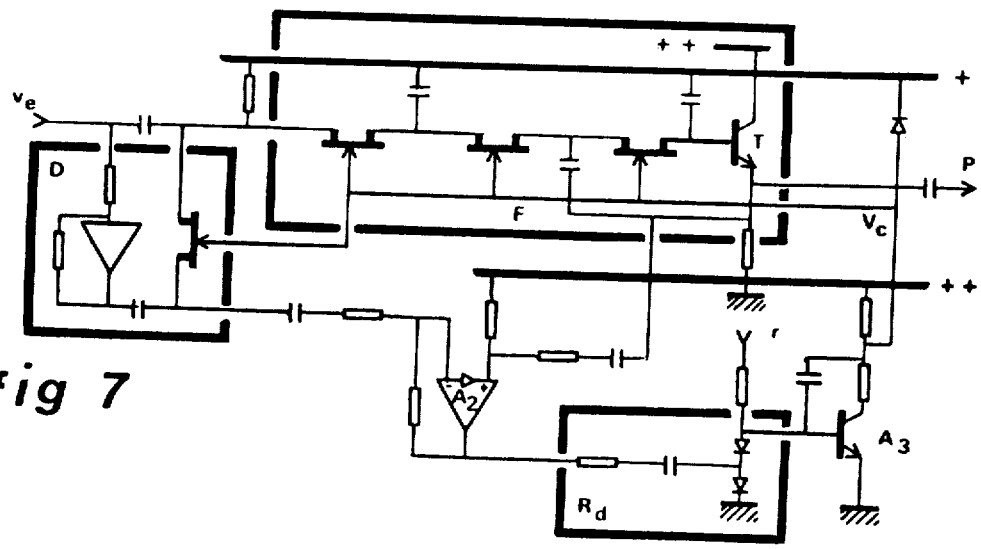
FIG. 7 is a schematic diagram of another preferred embodiment of the invention.

Reversely, or simultaneously, it would also be permitted to limit the attenuation of the error channel, the effect being, in the presence of an important A.F. signal, to deliver independently of $f_t$ value an error signal and to repel $f_t$ to its maximum value by saturation of the amplifier $A_3$; the effect of the device would therefore be obliterated by itself. The corresponding filtration circuit is then that of FIG. 4, which is found again in FIG. 7 accompanied by other improvements.

First of all, one may reproduce more faithfully than previously explained, the mask-effect in human hearing. The issue of Nov. 20, 1972 of the periodical *Electronics* gives on page 120 an example of the behavior of the human ear which shows that, if the slope of the mask-effect is effectively close to 18 dB/octave at the mean and low levels, this slope decreases when the intensity of the signal increases. On the other hand, the mask-effect is translated to about 20 dB below the level of the masking signal, in relation to higher frequencies. These properties will be reproduced in the signal processing device according to the invention if first of all, the filtering effect is reduced by using a transfer-function of the error channel limited as indicated hereinabove. Moreover, this same transfer function will be provided so as to be asymptotic to a straight line of slope −18 dB/octive giving already a 20 dB attenuation at the cut-off frequency of the main channel. In other words, one may consider either that the cut-off frequency at −3 dB of the error channel is translated from the high frequency direction in a ratio of $(10)^{\frac{1}{3}} = 2.15$ (for 18 dB/octave filters) above that of the main channel, or to define the transition frequency for a 10 dB attenuation on each channel.

Secondly, the reference signal $v_r$ representative of the noise level expected in the applied signal may be adjusted with a better accuracy.

A first means is to provide a manual adjustment accessible to the user.

A second more elaborated means is to modify the reference voltage $v_r$ in relation to a quality criterion, which may be the automatic gain control signal in a radio receiver, or still a direct measurement of the noise level in the incoming signal accomplished in a frequency band not utilized for the transmission of the A.F. signal.

The result will be still more accurate if the reference signal $v_r$ is corrected in relation to the foreseeable changes in the noise level taking into account the bandwith—essentially variable—by which it is transmitted; this result may be simply obtained by a static feed-back path, reproducing at least approximately the theoretical relation between the noise level and the bandwidth, disposed between the control voltage Vc of the filter and the reference signal $v_r$. The correction circuit will advantageously take into account the particular features of the A.F. transmission process, each as preaccentuation or utilization of a subcarrier, which modify sometimes considerably the noise level which is then very far from a white noise.

The different means above-mentioned indicate how the signal processing device according to the invention may be adapted to follow very closely a criterion or a group of criterion defining a useful signal, and therefore here to improve to the best degree the auditory quality of an A.F. signal.

Obviously, these means, described essentially with the object of reducing the high frequency components of a disturbing noise may likewise or jointly be used in the same way to act at the low frequency end of the audible spectrum.

Other examples of applications will be now more concisely set forth.

A first example makes use of a property of the device according to the invention which is that it constitutes if preceded by a modulation compressor, frequency follower filter. This filter could be a selective filter if the main channel is itself a band-pass filter, or if the Vc voltage controls simultaneously a narrow-band filter.

This property is usable, for example in hyper-frequency radio-altimeters where the beating pulsation is measured between a radiated wave having a continuous frequency sliding and the same wave reflected by the earth. The beating frequency—as well as the strength of the returned signal are a function of the elevation: therefore, this device will be advantageously preceded by a correcting circuit to compensate for the attenuation of the A.F. signal as a function of the elevation, i.e. its frequency. The received signal, thus insulated from the noise, is well suited for digital processing. Moreover, the Vc information may constitute in itself, a simplified means for measurement of the elevation.

Another field of application of a frequency follower filter according to this process is that of the musical synthesizers, where it will permit isolating a fundamental tone by processing of the low frequency end of the spectrum. It will therefore be preferable, taking into account the usually low amplitude of the fundamental in a vocal or musical signal, to provide for the error channel a filter having a slope of at least 24 dB/octave, i.e. a fourth (or higher) order filter. Likewise it will be permitted, a first fundamental being isolated with a band-pass filter and excluded in a high-pass main channel filter, to renew this process by cascading several analysis devices and in this manner extracting several successive fundamental tones.

If, in a second example, the filtration device according to the invention is still preceded by a modulation compressor, reducing to a level slightly higher than the 0 dB level of FIG. 6 the amplitude of a complex A.F. signal, it is understandable that the transition frequency $f_t$ will always be very close to the significant spectral ray fixing the upper limit of the transmitted useful bandwidth. Consequently, the bandwidth transmitted in the main channel will be strictly limited to that needed for a good intelligibility of the A.F. signal.

If, in a third example of application, possibly combined with the preceding one, the reference voltage $v_r$ is corrected by a signal representing a fraction of the level of the main channel signal or of the incoming signal, it is understood that the device may be adjusted to transmit such predetermined fraction of the applied signal, say, 80 or 95 percent. There is thus provided an improved means of restricting the used bandwidth taking into account a predetermined degradation of the applied signal.

The control voltage Vc representing the value of the cut-off frequency $f_t$, it being a linear function for the filter according to FIG. 4, is usable, on the one hand, to operate an identical filter processing a signal not having been subjected to dynamic compression, and, on the other hand, for the transmission of the said information.

Thus, there may be imagined a device for simultaneous transmission of several conversations where the sharing of the whole bandwidth is operated as a function of the effective needs of each channel, the statistical compensation between numerous channels permitting of ending in a high compression ratio of the needed total bandwidth, much higher than that of known systems using, for example, the silences in the conversations in order to insert extra-channels; what is more, the present device can be used jointly with such processes in the Time Assignment Speech Interpolation.

A preferred embodiment of such a device will be to use the information of useful bandwidth limits delivered by each channel (each Vc voltage) to control in a similar manner the frequencies, permitting to operate by the known digital or analogous means, the needed modulations or frequency translations needed for the transmission. These same frequencies may be transmitted advantageously in a restricted part of the spectrum after division by a constant ratio to constitute subcarriers used in the reverse frequency transposition. It will be indeed easy, by cascading several frequency-follower circuits as indicted in the first example, to analyse the subcarrier group to isolate each of them successively; they will then be applied to second analysis circuits determining the positioning of the transition frequencies of the filtering means assigned to each corresponding audio-frequency channel. The filtration carried out in each channel on each path of transmission must be evidently reproduced upon reception with the same cut-off frequencies to avoid any crosstalk between adjacent channels.

The third example above-mentioned gives likewise, by several simultaneous, or better still, successive filtrations in this way, a means for sharing an A.F. signal in several portions of the spectrum, each containing a predetermined fraction of the energy of the applied signal. The values of the corresponding transition frequencies being of easy transmission within a narrow spectrum, one thus provides a new means for voice analysis, more efficient than each Vc signal, representative of separation frequencies, is permanently carrying useful information.

It will be permitted to transmit only, as is known in this field, a limited part of the initial signal containing the fundamental tones (said basic band), which will occupy only a narrow part of the spectrum, accompanied by succinct information about the content of the remainder of the spectrum not directly transmitted, this information being the limit frequencies of the sharing in a reduced number of portions as described hereinabove. The corresponding Vc information can be transmitted directly or by means of subcarriers as also described.

The invention offers also the associated means of synthesis. The Vc information can be restored as control signals to as many adjustable frequency filters, whose error signal elaborating circuit will react this time on a level adjusting means to restore the energy attributed to the analysis of each channel, the filters being supplied by a noise generator, preferably correlated with the basic band of the initial signal.

Generally speaking, the different analaysis means mentioned above will find notable application in the voice-recognizer devices for delivering continuous information containing a much higher flow of information than the discrete signals delivered by the existing devices using the band-frequency analysis principle.

Another interesting property of a device according to FIG. 4 provided with a Butterworth-type frequency response of any other is that, at all frequencies, the sum of the powers delivered by the two channels is contant relative to the input signal. This property can be exploited in a channel separation device as used in the matrix quadraphonic systems, where the stereophonic effect may be enhanced in relation to the amplitude as is done in the decoders of the present art.

It can also be exploited in proceedings synthesizing extra stereophonic channels starting from conventional monophonic or stereophonic signals.

The different examples of applications formerly cited, far from being limitative, will permit, to the contrary, skilled technicians to imagine many other uses or adaptations within the field of the invention. The previous explanations will now permit a better understanding of the scope of the invention and of its characteristic elements, that are combined in FIG. 8, which represents the generalized form of the circuit according to the invention.

Figure 8:
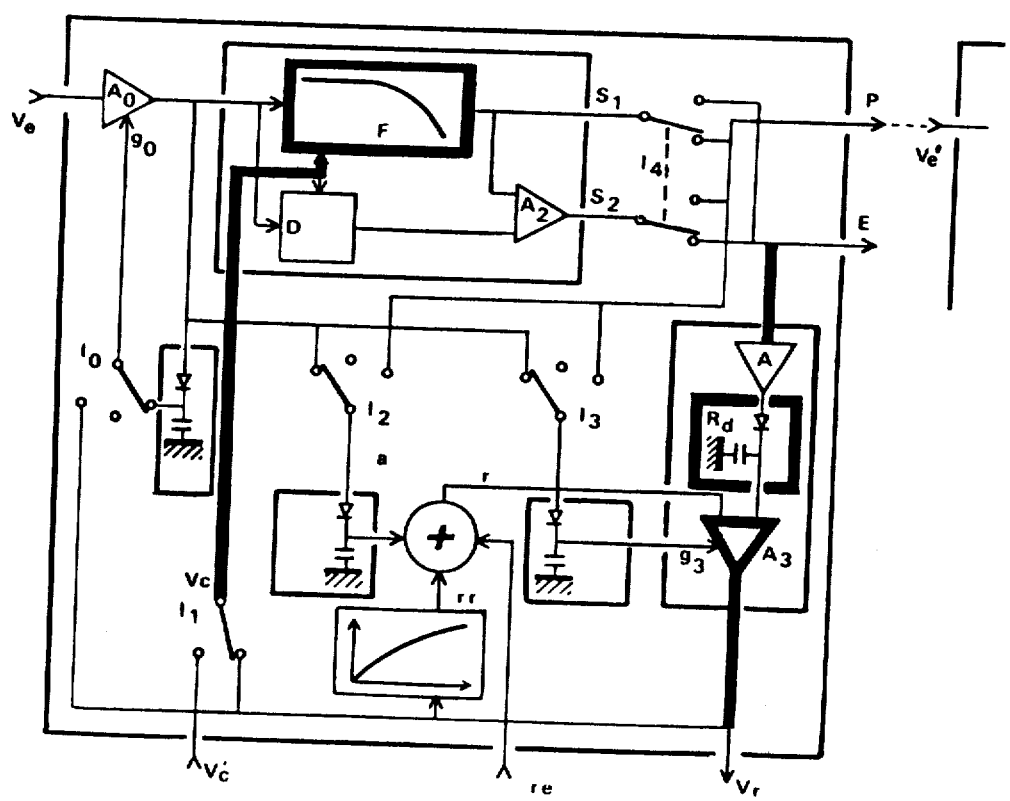
FIG. 8 is a generalized diagram of a processing circuit for analysis and treatment of signals according to the invention.

The FIG. 8 represents a channel constituting, in itself or in association with complete or incomplete analogous channels, an analysis and treatment device for signals according to the invention.

The characteristic elements of the invention, represented in heavy lines, are:

a filter F (high or low-pass) whose cut-off frequency is adjusted by means of a control voltage Vc, a device for elaboration of a feed-back signal, receiving the signal from an error channel E to rectify-it, then, after comparison with a reference voltage $v_r$, to amplify-it.

The accessory elements which, according to the applications, are present or not in the treatment channel are:

a means for adjusting the level of the incoming signal, here represented by an amplifier $A_0$ provided with a control of its amplification factor $g_0$.

Means for complementary filtering (here phase-correcting circuit D and differential amplifier $A_2$) permitting splitting of the incoming signal into two parts of complmentary spectra, physically available at points $S_1$ and $S_2$.

Means for elaboration of the reference voltage $v_r$ which may include in association or separately:

"an input for manual or automatic adjustment $v_{re}$"

"an input $v_{ra}$ for alternative signal delivering, after rectification, a contribution to the reference voltage $v_r$,"

"a local feedback path $v_{rr}$ giving an offset of the voltage $v_r$ function of the output signal of the amplifier $A_3$ and according to a predetermined law."

Other optional means may also be included in the treatment cell, as for example:

Amplifier for the error signal A

Control $g_3$ of the amplification factor of the amplifier $A_3$

Condenser transforming this amplifier into an integrator (not shown).

The treatment cell is furthermore characterized in that it includes a feed-back path connecting the output of the amplifier $A_3$:

either to the frequency-control Vc of the filter (generally for analysis treatments), or to the control $g_0$ for level adjustment of the incoming signal (generally for synthesis operations).

The treatment cell may thus adopt several configurations, symbolized in the FIG. 8 by switches:

switch $I_0$ which permits adjusting the input level either by action of the feed-back loop ($A_3$), either at a fixed value, or function of its output level, constituting in this case a modulation compressor, switch $I_1$, which permits receiving the control voltage Vc either from an external source, or from the feed-back loop ($A_3$), switch $I_2$, which permits offsetting the reference voltage $v_r$ as a function of the level of the signal applied for filtering or of the level of the signal of the main channel, switch $I_3$, which permits adjusting the amplification factor of the amplifier $A_3$ as a function of the level of the same signals in order to insure a stable and reproducible dynamic operation of the feed-back loop, switch $I_4$, that permits selecting as the main channel one or the other output of the splitting filter and reversely for the error channel.

Each cell may be provided with a certain number of inputs:

signal input Ve input for external control of the separation frequency Vc' input for external control of the reference voltage $v_{re}$ and with several outputs:

$V_r$ feed-back signal

P main channel

E error channel.

Several cells may be cascaded, the output P of the one being connected to the input Ve' of the following, etc . . . in order to operate successive treatments for analysis of the signal applied at the input of the first cell, or for separate treatments at both ends of the spectrum.

These cells will be complete, or active, if the feedback loop is completed, at least a part of the time, on this same cell.

An active cell may actuate another cell, which will be then a passive one (and most often an incomplete one if, for instance, its means for elaboration of a feed-back signal are employed and suppressed), to operate a substantially different treatment on the same or on a different signal, or again to function as an oscillator, constituting thus a voltage-to frequency converter.

The connections from a cell or a group of cells to one another may be remote, using any appropriate transmission means.

Obviously, other known elements or circuits may be used jointly with the aforementioned components characteristic of the invention, in many variations of use, of which only a few have been cited as examples.

Similarly, the embodiments could be varied, the invention being particularly well adapted, for example, to be constructed in modular form with an integrated circuit comprising all or a part of the components of FIG. 8, usable in many configurations in association with only some external components.

While the present invention has been described in connection with particular embodiments thereof, it will be understood by those skilled in the art that many changes and modifications may be made without departing from the true spirit and scope of the present invention. Therefore, it is intended by the appended claims to cover all such changes and modifications which come within the true spirit and scope of this invention.

What is claimed:

1. Apparatus for analyzing and processing an electric signal comprising first and second signal processing channels, filter means for splitting said signal into two complimentary signals respectively above and below a separation frequency and including control means responsive to a control signal applied thereto for adjusting said separation frequency, means for applying one of said complimentary signals to said first signal processing channel and for applying the other of said complimentary signals to said second signal processing channel, means for comparing one of said complimentary signals with a reference value to develop an error signal having a value related to the difference between said reference value and the value of said one of said complimentary signals, and means responsive to said error signal for providing a control signal for said filter means for adjusting said separation frequency to cause the level of said one of said complimentary signals to approach said reference value.

2. Apparatus according to claim 1 wherein
said filter means has first and second channels through which said complimentary signals are respectively transmitted,
said first channel of said filter means has a frequency response substantially the same as a second order or more Butterworth-type filter.

3. Apparatus according to claim 1 wherein said means for providing a control signal comprises
amplifier means having a gain which varies with the level of the signal applied thereto.

4. Apparatus according to claim 1 wherein
said electric signal includes noise components,
said reference value being greater than the level of said noise components.

5. Apparatus according to claim 1 wherein
said reference value is varied in relation to the bandwidth of the signal processing channel through which said one of said complimentary signals is transmitted.

6. Apparatus according to claim 1 wherein
the transfer function of at least one of said signal processing channels is substantially that of a 3rd order Butterworth-type filter having a minimum asymptotic attenuation of 20 dB.

7. Apparatus according to claim 6 wherein
the other of said signal processing channels has a complimentary transfer function, and includes
means for developing said complimentary transfer function by obtaining the difference between the applied signal and said one of said complimentary signals.

8. Apparatus according to claim 7 wherein said filter means comprises
a high pass filter and a low pass filter,
the −3 dB frequency cut off of said low pass filter being substantially lower than the −3 dB frequency cut off of said high pass filter.

9. Apparatus according to claim 8 wherein
the attenuation of one of said signal processing channels at the −3 dB cut-off frequency of the other signal processing channel is about 20 dB.

10. Apparatus according to claim 1 wherein at least one of said signal processing channels comprises
means for integrating the signal transmitted thereby.

11. Apparatus according to claim 1 wherein
the applied signal is processed successively in two signal processing channels to carry out a reduction of its bandwidth starting from the high and low ends of the spectrum.

12. Apparatus according to claim 1 comprising
means to carry out on itself a dynamic compression of the applied signal,
said control signal for said filter means being available to be used outside the processing channel.

13. Apparatus according to claim 1 wherein said reference voltage is increased in relation to the level of the signal in the other signal processing channel.

14. Apparatus according to claim 12 characterized in that said control signal tunes the filtering means of at least one other processing channel.

15. Apparatus according to claim 12 characterized in that the applied signal is processed successively in two processing channels for operation at the high and low frequency ends of the spectrum.

16. Apparatus according to claim 14 for separating the applied signal and to synthesize additional channels, characterized in that
the tune filtering means of said processing channels provide complementary transfer functions of the Butterworth type.

17. Apparatus according to claim 12 characterized in that said control signals of the filtering means of each channel are used to control the frequency transposition of the respectively filtered A. F. signals.

18. Apparatus according to claim 17 characterized in that an applied signal is processed successively in several processing channels and in that the frequency control signals of the successive channels are remotely transmitted.

19. Apparatus according to claim 18 characterized in that the remote transmission of the frequency control signals is accomplished by means of voltage-to-frequency converters.

20. Apparatus for processing signals comprising
means for adjusting the level of one or more signals respectively applied to one or more processing channels,
filter means for splitting, on each processing channel, the applied signal or signals into two parts of adjacent spectra on opposite sides of a separation frequency, said filter means being provided with a control for the adjustment of the separation frequency and of at least one output of a filtered signal channel,
means for developing at least one feed-back signal by comparison with a signal representative of the level of the filtered signal to a reference value to react after amplification and integration on the level adjustment means of the corresponding processing channel,
the said feed-back signal having a tendency to lock the signal representative of the level of the filtered signal in the vicinity of the reference value by adjustment of the level of the applied signal.

21. Apparatus according to claim 20 for use in speech synthesis by restoration of the spectral distribution of a wide part of the spectrum of an analysed signal, comprising
analysis means connected to the frequency control inputs of said processing channels, and
noise generator means for providing the signal connected to said means for adjusting.

22. Apparatus according to claim 1 wherein said means for providing a control signal comprises
amplifier means.

23. Apparatus according to claim 16 wherein said means for providing a control signal comprises
integrating means.

* * * * *